United States Patent
Kuo et al.

(10) Patent No.: US 8,421,104 B2
(45) Date of Patent: Apr. 16, 2013

(54) LIGHT EMITTING DIODE APPARATUS AND METHOD FOR ENHANCING LUMINOUS EFFICIENCY THEREOF

(75) Inventors: Ming-teng Kuo, Taoyuan (TW);
Jang-ho Chen, Taoyuan (TW);
Ching-hwa Chang Jean, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 239 days.

(21) Appl. No.: 12/785,780

(22) Filed: May 24, 2010

(65) Prior Publication Data
US 2011/0284892 A1 Nov. 24, 2011

(51) Int. Cl.
*H01L 33/00* (2010.01)
*H01L 21/00* (2006.01)

(52) U.S. Cl.
USPC 257/98; 257/99; 257/E33.005; 257/E33.006; 257/E33.058; 257/E33.061; 257/E33.068; 438/27; 438/29

(58) Field of Classification Search .......... 257/98, 257/99, E33.005, E33.006, E33.058, E33.061, 257/E33.068; 438/27, 29
See application file for complete search history.

(56) References Cited

U.S. PATENT DOCUMENTS

| | | | |
|---|---|---|---|
| 5,779,924 A * | 7/1998 | Krames et al. | 216/24 |
| 6,791,119 B2 * | 9/2004 | Slater et al. | 257/99 |
| 7,667,224 B2 * | 2/2010 | Ohashi et al. | 257/13 |
| 7,763,906 B2 * | 7/2010 | Namioka | 257/99 |
| 2006/0202219 A1 * | 9/2006 | Ohashi et al. | 257/98 |
| 2007/0069231 A1 | 3/2007 | Namioka | |
| 2010/2010046 | 8/2010 | Kao | |

FOREIGN PATENT DOCUMENTS

| | | |
|---|---|---|
| CN | 1552103 | 12/2004 |
| CN | 101515621 | 8/2009 |

OTHER PUBLICATIONS

Chinese Office Action and Search Report issued by the China State Intellectual Property Office, dated Jul. 16, 2012 in a counterpart Chinese patent application No. CN 201010191823.9.

* cited by examiner

*Primary Examiner* — David Zarneke
(74) *Attorney, Agent, or Firm* — Chen Yoshimura LLP

(57) ABSTRACT

A light emitting diode apparatus with enhanced luminous efficiency is disclosed in the present invention. The light emitting diode apparatus includes a light emitting diode chip for providing a first light beam; a substrate, having a cross-section of a trapezoid, for supporting the light emitting diode chip, which is transparent to the first light beam; and an encapsulating body, containing a phosphor and encapsulating the light emitting diode chip and the substrate, for fixing the light emitting diode chip and the substrate and providing a second light beam when the phosphor is excited by the first light beam. Due to the shape of the substrate, contact area of the substrate with the phosphor is enlarged. Luminous efficiency is enhanced as well.

15 Claims, 7 Drawing Sheets

LIGHT EMITTING DIODE APPARATUS AND METHOD FOR ENHANCING LUMINOUS EFFICIENCY THEREOF

FIELD OF THE INVENTION

The present invention relates to a light emitting diode apparatus. More particularly, the present invention relates to a light emitting diode apparatus having an enlarged contact area of the substrate with a phosphor surrounded so that luminous efficiency can be enhanced.

BACKGROUND OF THE INVENTION

In recent researches, how to increase luminous efficiency of a light emitting diode is always the key point. When a light emitting diode is turned on, light beams from the active layer scatter to all directions. Some are efficiently utilized; some are absorbed by the substrate. A good illustration is shown in FIG. 1. A common light emitting diode 10 is composed of a sapphire substrate 102, a LED chip 104 and an encapsulating body 106. The LED chip 104 is epitaxially grown on the sapphire substrate 102 and generates light beams. The LED chip 104 and the sapphire substrate 102 are packaged in and protected by the encapsulating body 106. All arrows represent light beams emitted from the LED chip 104. It is obvious that the light beams scatter omnidirectionally. The solid arrows indicate light beams directly emitting out of the light emitting diode 10 which provides efficient lighting. Meanwhile, the dotted arrows and dashed arrows indicate light beams emitting towards the sapphire substrate 102.

The dotted arrows represent light beams enclosed in the sapphire substrate 102 which does not contribute to lighting of the light emitting diode 10 due to absorption of the sapphire substrate 102 mainly caused by total internal reflection. On the other hand, the dashed arrows show light beams which have a chance to be released from the sapphire substrate 102 without being absorbed. A design to improve the sapphire substrate 102 so that more entrapped light beams can be utilized is desired.

U.S. Pat. No. 6,791,119 shows an improved substrate structure for the purpose above. Please see FIG. 2. Light emitting diodes include a substrate which has first and second opposing faces and is transparent to optical radiation in a predetermined wavelength range. The substrate has a patterned cross-section. A number of pedestals extend into the substrate from the first face towards the second face. A diode region on the second face is configured to emit light in the predetermined wavelength range into the substrate upon application of voltage across the diode region. A mounting support on the diode region, opposite to the substrate, is configured to support the diode region. Therefore, the light emitted from the diode region into the substrate is emitted from the first face upon application of voltage across the diode region. The first face of the substrate may include many grooves that define many triangular pedestals in the substrate. The grooves may include tapered sidewalls and/or a beveled floor. The first face of the substrate also may include an array of via holes. The via holes may include tapered sidewalls and/or a floor.

The '119 patent points out one feature to enhance luminous efficiency: tapered slopes formed due to different sizes of the first and second opposing faces. However, the aforementioned design of '119 patent is mainly ideal for a light emitting diode which is not enclosed by a phosphor. Due to its structure, the light emitting diode of the prior art is not easy to manufacture.

In order to overcome those defects mentioned above and provide an easy way to enhance luminous efficiency of a light emitting diode, the present invention uses an enlarged contact area of light emitting diode substrate for contacting more phosphor. Luminous efficiency is enhanced as well. The present invention is also advantageous to carry out easily.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a light emitting diode apparatus with enhanced luminous efficiency, comprises: a light emitting diode chip for providing a first light beam; a substrate, having a cross-section of a trapezoid, for supporting the light emitting diode chip, which is transparent to the first light beam; and an encapsulating body, containing a phosphor and encapsulating the light emitting diode chip and the substrate, for fixing the light emitting diode chip and the substrate and providing a second light beam when the phosphor is excited by the first light beam.

Preferably, the substrate has grooves on a slope of the trapezoid.

Preferably, the grooves are formed by plasma etching, sputter etching, ion beam etching, reactive ion etching, laser cutting or mechanical cutting.

Preferably, the substrate is a sapphire substrate.

Preferably, the substrate is shaped by electron beam lithography, laser beam direct writing, gray-scale lithography, diamond ruling, focus ion beam milling or laser ablation.

Preferably, the encapsulating body is made of epoxy resin, silicone, polyetherimide, fluorocarbon polymer, polymethyl methacrylate (PMMA), polycarbonate (PC), or cyclo olefin copolymer (COC).

In accordance with another aspect of the present invention, a method for enhancing luminous efficiency of a light emitting diode apparatus, comprises the steps of: forming a substrate, having a cross-section of a trapezoid; growing a light emitting diode chip on the substrate; providing a first light beam by the light emitting diode chip; encapsulating the substrate, the light emitting diode chip and a phosphor; and exciting the phosphor by the first light beam to provide a second light beam.

Preferably, the present invention further comprises a step of forming a plurality of grooves on a slope of the trapezoid.

Preferably, the grooves are formed by plasma etching, sputter etching, ion beam etching, reactive ion etching, laser cutting or mechanical cutting.

Preferably, the forming step is performed by electron beam lithography, laser beam direct writing, gray-scale lithography, diamond ruling, focus ion beam milling or laser ablation.

Preferably, the substrate is a sapphire substrate.

Preferably, the encapsulating step is performed by epoxy resin, silicone, polyetherimide, fluorocarbon polymer, polymethyl methacrylate (PMMA), polycarbonate (PC), or cyclo olefin copolymer (COC).

In accordance with yet another aspect of the present invention, a method for enhancing luminous efficiency of a light emitting diode apparatus, comprises the steps of: growing a light emitting diode chip on a substrate; forming the substrate to have a cross-section of a trapezoid; providing a first light beam by the light emitting diode chip; encapsulating the substrate, the light emitting diode chip and a phosphor; and exciting the phosphor by the first light beam to provide a second light beam.

Preferably, the present invention further comprises a step of forming a plurality of grooves on a slope of the trapezoid.

Preferably, the grooves are formed by plasma etching, sputter etching, ion beam etching, reactive ion etching, laser cutting or mechanical cutting.

Preferably, the forming step is performed by electron beam lithography, laser beam direct writing, gray-scale lithography, diamond ruling, focus ion beam milling or laser ablation.

Preferably, the substrate is a sapphire substrate.

Preferably, the encapsulating step is performed by epoxy resin, silicone, polyetherimide, fluorocarbon polymer, polymethyl methacrylate (PMMA), polycarbonate (PC), or cyclo olefin copolymer (COC).

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illumination and description only; it is not intended to be exhaustive or to be limited to the precise form disclosed.

In order to have good understanding of the spirit of the present invention, two embodiments are provided below with detailed description.

First Embodiment

Figure 3:
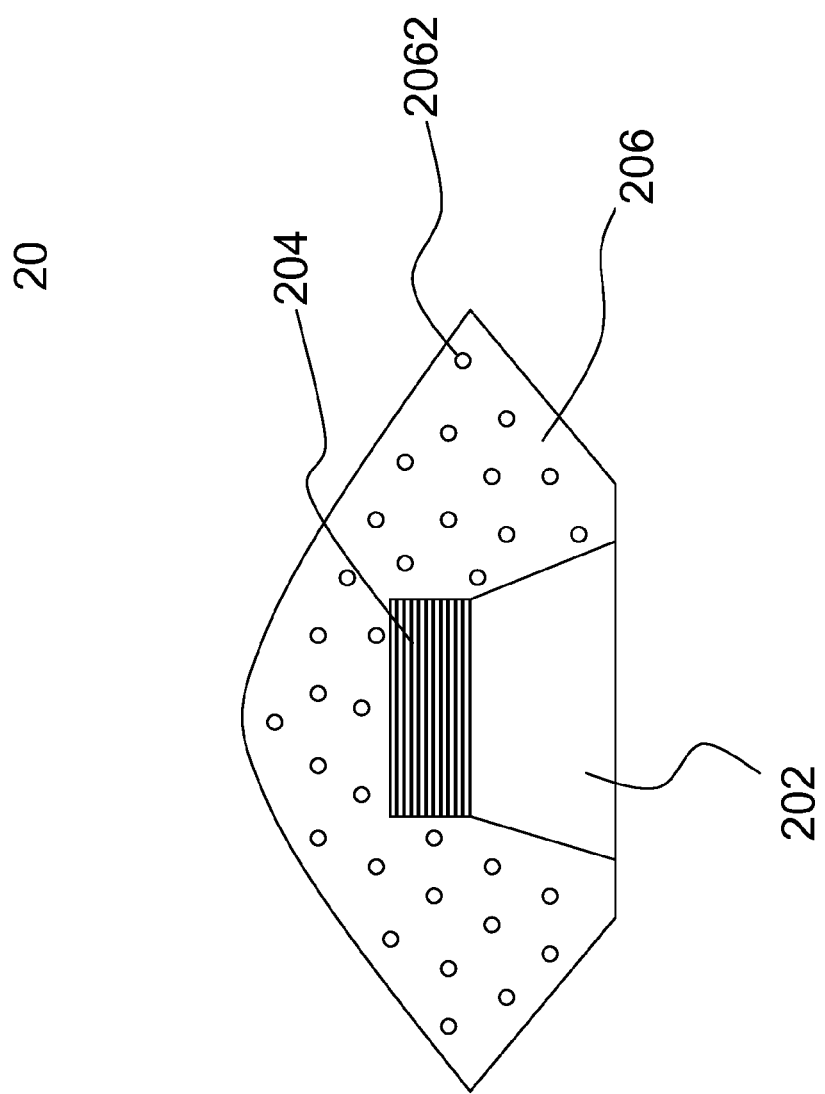
FIG. 3 illustrates a first embodiment of the present invention.
Figure 4:
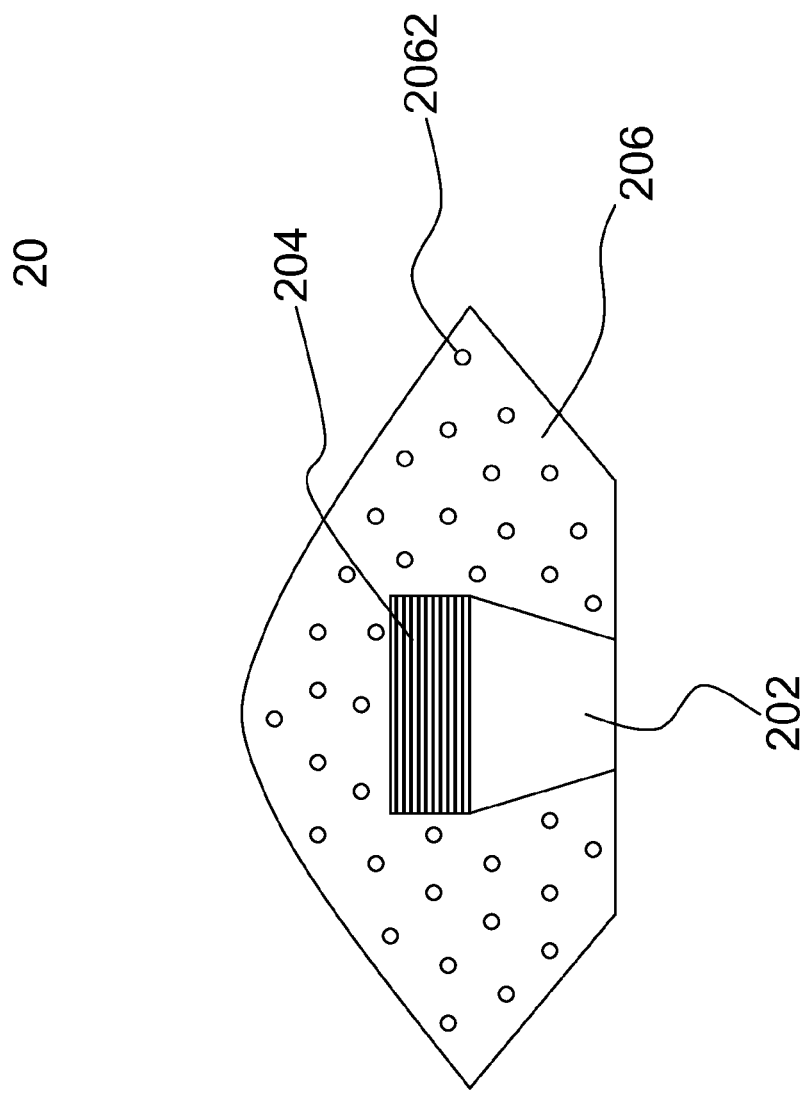
FIG. 4 shows an alternative to the first embodiment.

Please refer to FIG. 3 and FIG. 4. A first embodiment of the present invention is illustrated. In FIG. 3, a light emitting diode apparatus 20 comprises a substrate 202, a light emitting diode chip 204 and an encapsulating body 206. The light emitting diode chip 204 can provide a first light beam. The substrate 202 has a cross-section of a trapezoid. The substrate 202 is for supporting the light emitting diode chip 204 and is transparent to the first light beam from the light emitting diode chip 204. In this embodiment, the substrate 202 is a sapphire substrate. The encapsulating body 206 contains a phosphor 2062 and encapsulates the light emitting diode chip 204 and the substrate 202. It is for fixing the light emitting diode chip 204 and the substrate 202 and providing a second light beam when the phosphor 2062 is excited by the first light beam. In practice, combination of the first light beam and the second light beam can simulate a white light beam to human eyes.

Figure 1:
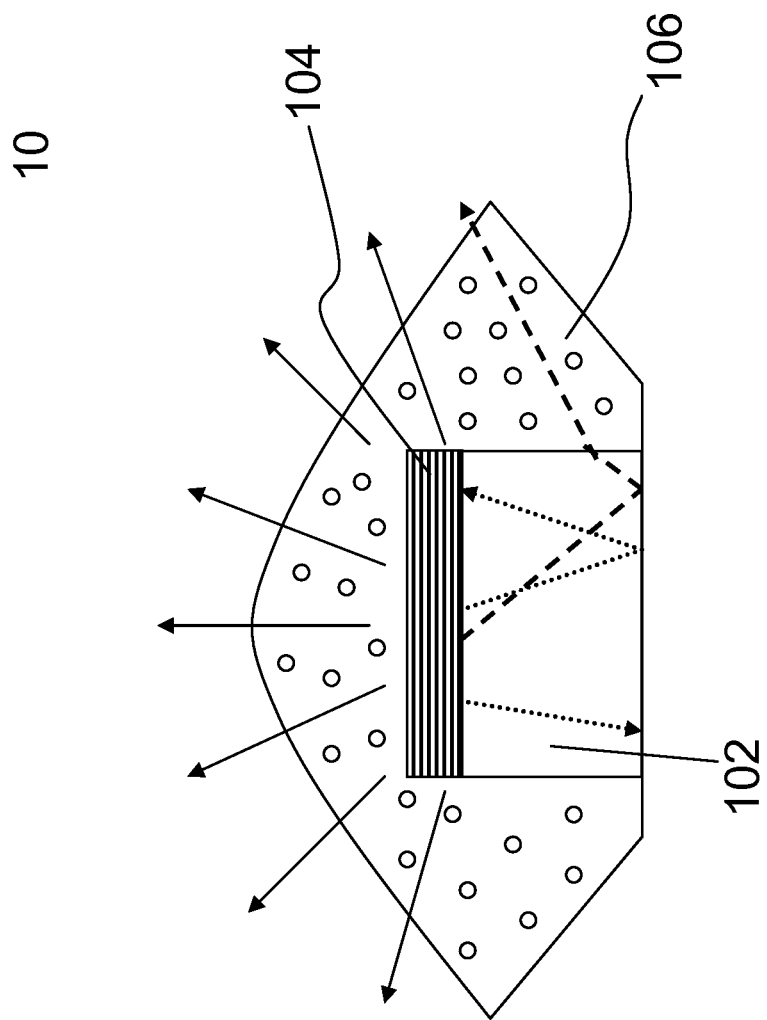
FIG. 1 shows a conventional light emitting diode of a prior art.
Figure 2:
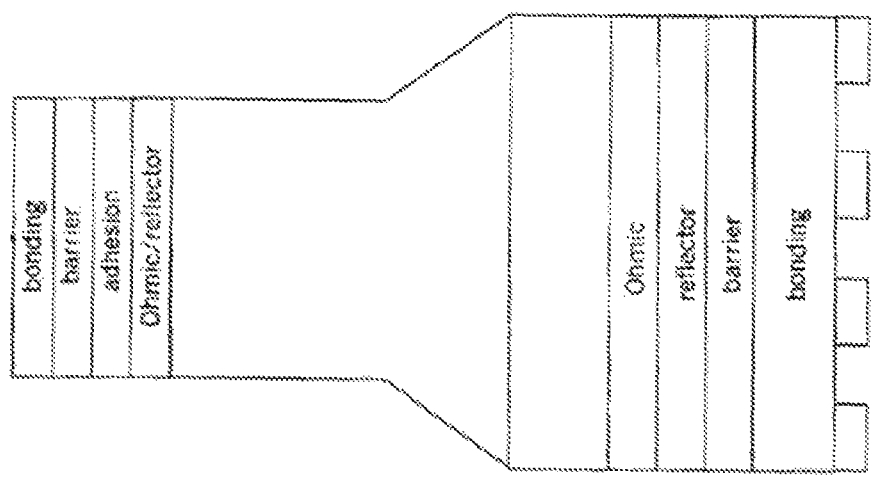
FIG. 2 shows an improved light emitting diode of another prior art.

In comparison with the prior art illustrated in FIG. 1, the substrate 202 has a cross-section of a trapezoid rather than rectangle. Therefore, contact area of the substrate 202 with the phosphor 2062 in the encapsulating body 206 is larger than that of the substrate 102 in FIG. 1 if both substrates 102 and 202 have the same size of top surfaces and the same height. Luminous efficiency can be improved by the structure of the substrate 202.

A method for forming the light emitting diode apparatus 20 and achieving a combined light beam includes following steps: First, form the substrate 202 which has a cross-section of a trapezoid. Then, grow a light emitting diode chip 204 on the substrate 202. Alternatively, the sequence of the forming and growing steps can be exchanged. In other words, a light emitting diode chip 204 is grown on a substrate 202 before the substrate 202 is formed to have a cross-section of a trapezoid.

Provide the first light beam by the light emitting diode chip 204 and encapsulate the substrate 202, the light emitting diode chip 204 and a phosphor 2062. Finally, excite the phosphor 2062 by the first light beam to provide a second light beam. Mixture of the first and second light beams leads to the white light beam.

In the present embodiment, slopes of the substrate 202 are shaped by electron beam lithography. Actually, there are other means to accomplish the same goal, for example, laser beam direct writing, gray-scale lithography, diamond ruling, focus ion beam milling, laser ablation and so on. The encapsulating body 206 is made of an epoxy resin. It should be noticed that it is not limited to epoxy resin only. The encapsulating body 206 can be made of silicone, polyetherimide, fluorocarbon polymer, polymethyl methacrylate (PMMA), polycarbonate (PC), or cyclo olefin copolymer (COC).

According to the present invention, the cross-section of the substrate 202 is a trapezoid. Therefore, the bottom surface of the substrate 202 is not necessary larger than the top surface of the substrate 202. Please refer to FIG. 4. The top surface of the substrate 202 is larger than the bottom surface while the cross-section of the substrate 202 is still a trapezoid. Thus, the contact area of the substrate 202 with the phosphor 2062 in the encapsulating body 206 is enlarged. Luminous efficiency can also be improved.

Second Embodiment

Figure 5:
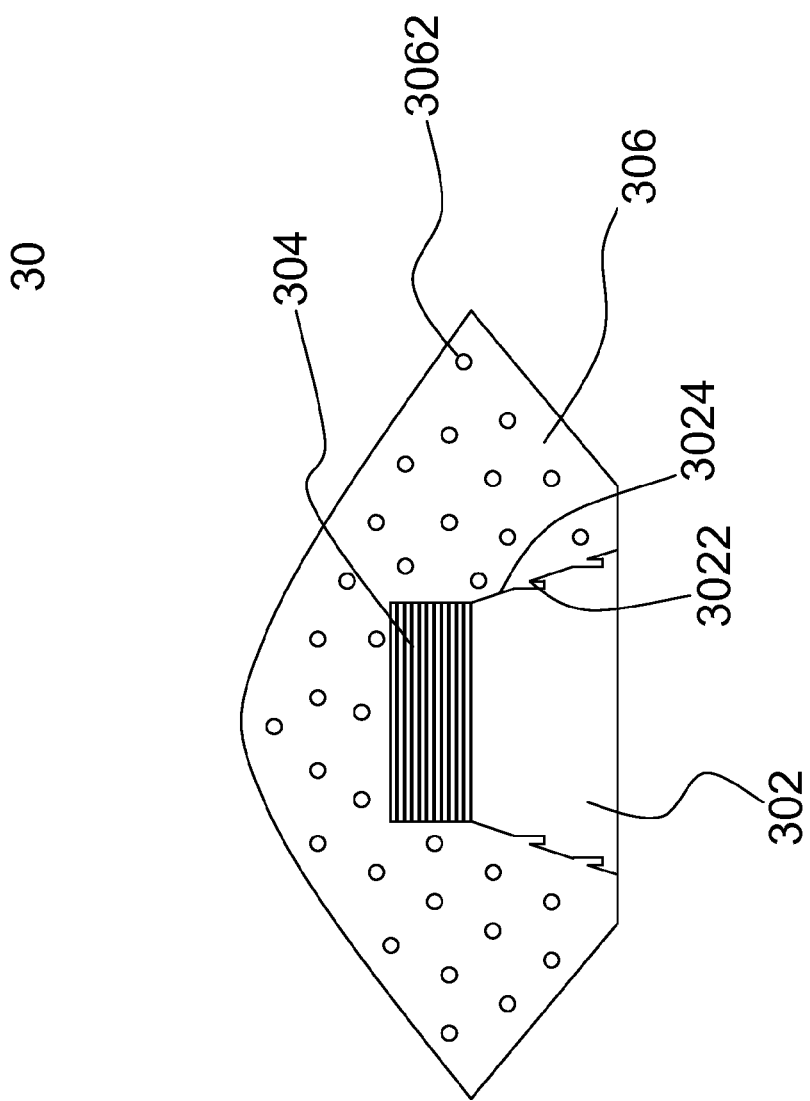
FIG. 5 illustrates a second embodiment of the present invention.
Figure 6:
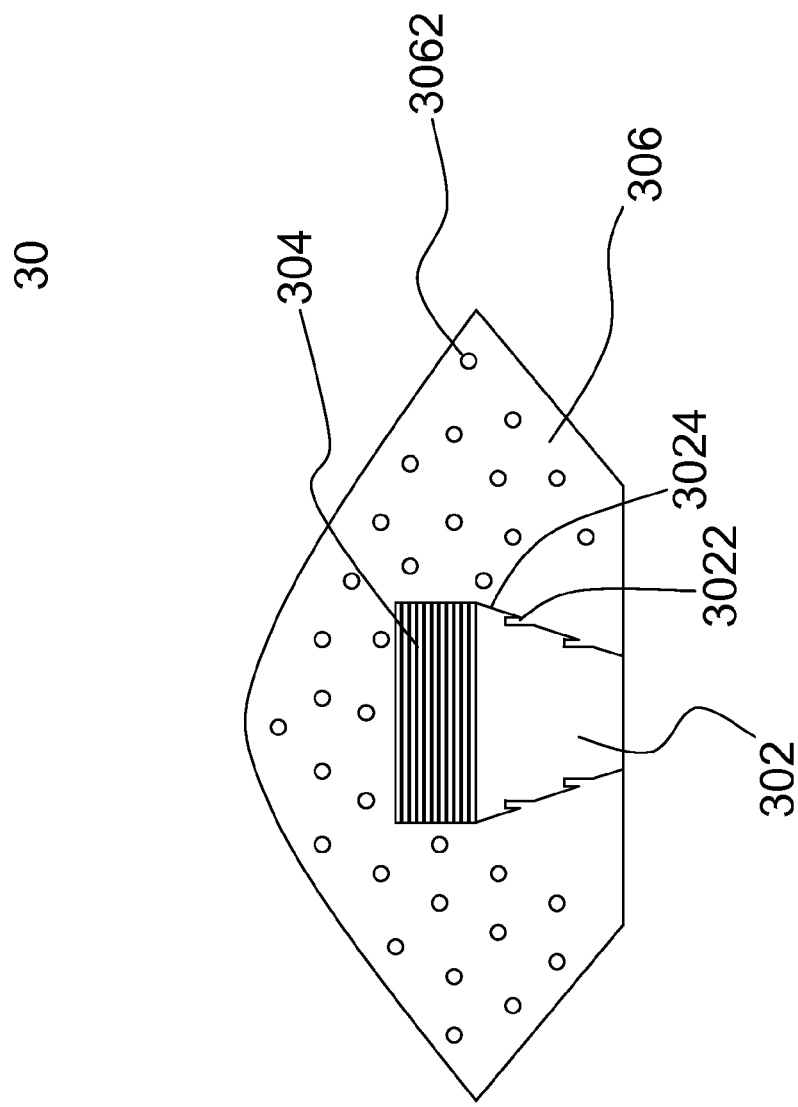
FIG. 6 shows an alternative to the second embodiment.
Figure 7:
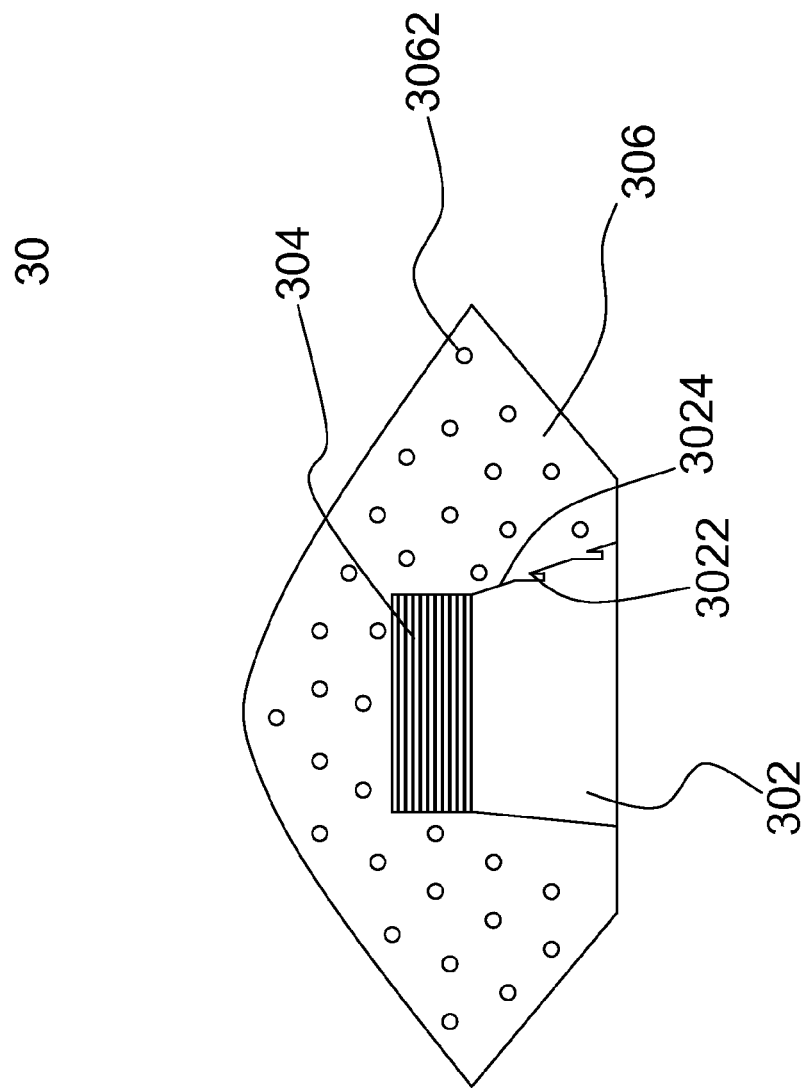
FIG. 7 shows a combination of the first and second embodiments.

Please refer to FIG. 5 to FIG. 7. A second embodiment of the present invention is illustrated. In FIG. 5, a light emitting diode apparatus 30 comprises a substrate 302, a light emitting diode chip 304 and an encapsulating body 306. The light emitting diode chip 304 can provide a first light beam. The substrate 302 has a cross-section of a trapezoid. It is for supporting the light emitting diode 304 and is transparent to the first light beam from the light emitting diode chip 304. In this embodiment, the substrate 302 is a sapphire substrate, as in the first embodiment. The encapsulating body 306 contains a phosphor 3062 and encapsulates the light emitting diode chip 304 and the substrate 302. It is for fixing the light emitting diode chip 304 and the substrate 302 and providing a second light beam when the phosphor 3062 is excited by the first light beam.

Different from the first embodiment, the substrate 302 has grooves 3022 on a slope 3024 of the trapezoid. The grooves 3022 are formed by plasma etching. In practice, sputter etching, ion beam etching, reactive ion etching, laser cutting or mechanical cutting can be used instead. They can provide the same effect. The grooves 3022 allow more contact area of the substrate 302 with the phosphor 3062.

Similarly, contact area of the substrate 302 with the phosphor 3062 in the encapsulating body 306 is larger than that of the substrate 102 in FIG. 1 if both substrates 102 and 302 have the same size of top surfaces and the same height. Luminous efficiency can be improved by the structure of the substrate 302.

In the present embodiment, the slopes 3024 of the substrate 302 are shaped by electron beam lithography. Similarly, laser beam direct writing, gray-scale lithography, diamond ruling, focus ion beam milling or laser ablation is also applicable. The encapsulating body 306 is made of an epoxy resin. Like the first embodiment, it is not limited to epoxy resin only. The encapsulating body 306 can be made of silicone, polyetherimide, fluorocarbon polymer, polymethyl methacrylate (PMMA), polycarbonate (PC), or cyclo olefin copolymer (COC).

According to the present invention, the cross-section of the substrate 302 is a trapezoid. Therefore, the bottom surface of the substrate 302 is not necessary larger than the top surface of the substrate 302. Please refer to FIG. 6. The top surface of the substrate 302 is larger than the bottom surface while the cross-section of the substrate 302 is still a trapezoid. Thus, the contact area of the substrate 302 with the phosphor 3062 in the encapsulating body 306 is enlarged. Luminous efficiency can also be improved.

It should be noticed that any non-vertical slope 3024 can be used according to the spirit of the present invention. It is not limited for both slopes 3024 to have grooves 3022. Please see FIG. 7. Asymmetrical trapezoid is also an ideal example for the present invention which has grooves 3022 on only one slope 3024.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A light emitting diode apparatus with enhanced luminous efficiency, comprising:
    a light emitting diode chip for providing a first light beam;
    a substrate, having a cross-section of a trapezoid defining a top surface, for supporting the light emitting diode chip, which is transparent to the first light beam, the substrate having grooves on a slope of the trapezoid, the grooves extending into the slope of the substrate in a direction perpendicular to the top surface; and
    an encapsulating body, containing a phosphor and encapsulating the light emitting diode chip and the substrate, for fixing the light emitting diode chip and the substrate and providing a second light beam when the phosphor is excited by the first light beam.

2. The light emitting diode apparatus according to claim 1, wherein the grooves are formed by plasma etching, sputter etching, ion beam etching, reactive ion etching, laser cutting or mechanical cutting.

3. The light emitting diode apparatus according to claim 1, wherein the substrate is a sapphire substrate.

4. The light emitting diode apparatus according to claim 1, wherein the substrate is shaped by electron beam lithography, laser beam direct writing, gray-scale lithography, diamond ruling, focus ion beam milling or laser ablation.

5. The light emitting diode apparatus according to claim 1, wherein the encapsulating body is made of epoxy resin, silicone, polyetherimide, fluorocarbon polymer, polymethyl methacrylate (PMMA), polycarbonate (PC), or cyclo olefin copolymer (COC).

6. A method for enhancing luminous efficiency of a light emitting diode apparatus, comprising the steps of:
    forming a substrate, having a cross-section of a trapezoid defining a top surface;
    forming a plurality of grooves on a slope of the trapezoid, the grooves extending into the slope of the substrate in a direction perpendicular to the top surface;
    growing a light emitting diode chip on the substrate;
    providing a first light beam by the light emitting diode chip;
    encapsulating the substrate, the light emitting diode chip and a phosphor; and
    exciting the phosphor by the first light beam to provide a second light beam.

7. The method according to claim 6, wherein the grooves are formed by plasma etching, sputter etching, ion beam etching, reactive ion etching, laser cutting or mechanical cutting.

8. The method according to claim 6, wherein the step of forming the substrate is performed by electron beam lithography, laser beam direct writing, gray-scale lithography, diamond ruling, focus ion beam milling or laser ablation.

9. The method according to claim 6, wherein the substrate is a sapphire substrate.

10. The method according to claim 6, wherein the encapsulating step is performed by epoxy resin, silicone, polyetherimide, fluorocarbon polymer, polymethyl methacrylate (PMMA), polycarbonate (PC), or cyclo olefin copolymer (COC).

11. A method for enhancing luminous efficiency of a light emitting diode apparatus, comprising the steps of:
    growing a light emitting diode chip on a substrate;
    forming the substrate to have a cross-section of a trapezoid defining a top surface;
    forming a plurality of grooves on a slope of the trapezoid, the grooves extending into the slope of the substrate in a direction perpendicular to the top surface;
    providing a first light beam by the light emitting diode chip;
    encapsulating the substrate, the light emitting diode chip and a phosphor; and
    exciting the phosphor by the first light beam to provide a second light beam.

12. The method according to claim 11, wherein the grooves are formed by plasma etching, sputter etching, ion beam etching, reactive ion etching, laser cutting or mechanical cutting.

13. The method according to claim 11, wherein the step of forming the substrate is performed by electron beam lithography, laser beam direct writing, gray-scale lithography, diamond ruling, focus ion beam milling or laser ablation.

14. The method according to claim 11, wherein the substrate is a sapphire substrate.

15. The method according to claim 11, wherein the encapsulating step is performed by epoxy resin, silicone, polyetherimide, fluorocarbon polymer, polymethyl methacrylate (PMMA), polycarbonate (PC), or cyclo olefin copolymer (COC).

* * * * *